(12) United States Patent
Ha et al.

(10) Patent No.: US 10,100,408 B2
(45) Date of Patent: Oct. 16, 2018

(54) EDGE HUMP REDUCTION FACEPLATE BY PLASMA MODULATION

(71) Applicant: Applied Materials, Inc., Santa Clara, CA (US)

(72) Inventors: Sungwon Ha, Palo Alto, CA (US); Kwangduk Douglas Lee, Redwood City, CA (US); Ganesh Balasubramanian, Sunnyvale, CA (US); Juan Carlos Rocha-Alvarez, San Carlos, CA (US); Martin Jay Seamons, San Jose, CA (US); Ziqing Duan, Sunnyvale, CA (US); Zheng John Ye, Santa Clara, CA (US); Bok Hoen Kim, San Jose, CA (US); Lei Jing, Santa Clara, CA (US); Ngoc Le, Santa Clara, CA (US); Ndanka Mukuti, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 182 days.

(21) Appl. No.: 14/594,296

(22) Filed: Jan. 12, 2015

(65) Prior Publication Data
US 2015/0247237 A1 Sep. 3, 2015

Related U.S. Application Data

(60) Provisional application No. 61/947,077, filed on Mar. 3, 2014.

(51) Int. Cl.
*C23C 16/455* (2006.01)
*C23C 16/44* (2006.01)
(Continued)

(52) U.S. Cl.
CPC .... *C23C 16/45565* (2013.01); *C23C 16/4401* (2013.01); *C23C 16/4585* (2013.01);
(Continued)

(58) Field of Classification Search
CPC .......... C23C 16/45565; C23C 16/5096; C23C 16/4585; C23C 16/4401; H01J 37/32449; H01J 37/32091
(Continued)

(56) References Cited

U.S. PATENT DOCUMENTS 4,780,169 A 10/1988 Stark et al.
6,050,506 A 4/2000 Guo et al.
(Continued)

OTHER PUBLICATIONS

International Search Report and Written Opinion for International Application No. PCT/US2015/011716 dated Apr. 29, 2015.

*Primary Examiner* — Rudy Zervigon
(74) *Attorney, Agent, or Firm* — Patterson + Sheridan LLP

(57) ABSTRACT

Embodiments described herein relate to a faceplate for improving film uniformity. A semiconductor processing apparatus includes a pedestal, an edge ring and a faceplate having distinct regions with differing hole densities. The faceplate has an inner region and an outer region which surrounds the inner region. The inner region has a greater density of holes formed therethrough when compared to the outer region. The inner region is sized to correspond with a substrate being processed while the outer region is sized to correspond with the edge ring.

18 Claims, 3 Drawing Sheets

(51) Int. Cl.
 *C23C 16/458* (2006.01)
 *C23C 16/509* (2006.01)
 *H01J 37/32* (2006.01)

(52) U.S. Cl.
 CPC .... *C23C 16/5096* (2013.01); *H01J 37/32091* (2013.01); *H01J 37/32449* (2013.01)

(58) Field of Classification Search
 USPC ............... 118/715, 728; 156/345.33, 345.34, 156/345.51
 See application file for complete search history.

(56) References Cited

U.S. PATENT DOCUMENTS

| | | | |
|---|---|---|---|
| 6,106,625 A * | 8/2000 | Koai | ..................... C23C 16/455 118/715 |
| 6,983,892 B2 | 1/2006 | Noorbakhsh et al. | |
| 7,955,986 B2 * | 6/2011 | Hoffman | ........... H01J 37/32091 118/723 E |
| 8,097,082 B2 | 1/2012 | Zhou et al. | |
| 2002/0042192 A1 | 4/2002 | Tanaka et al. | |
| 2008/0196666 A1 | 8/2008 | Toshima | |
| 2012/0222815 A1 | 9/2012 | Sabri et al. | |
| 2013/0084668 A1 * | 4/2013 | Seymour | ................. C23C 16/54 438/57 |
| 2013/0334344 A1 | 12/2013 | Leeser et al. | |
| 2013/0341433 A1 | 12/2013 | Roy et al. | |

\* cited by examiner

EDGE HUMP REDUCTION FACEPLATE BY PLASMA MODULATION

CROSS REFERENCE TO RELATED APPLICATIONS

This application claims benefit of U.S. provisional patent application No. 61/947,077, filed Mar. 3, 2014, the entirety of which is herein incorporated by reference.

BACKGROUND

Field

Embodiments described herein generally relate to particle reduction and improvements in film uniformity in semiconductor processes. More specifically, embodiments described herein relate to edge hump reduction via a plasma modulation faceplate.

Description of the Related Art

Reducing the generation of undesirable particles during semiconductor processing is important in forming defect-free microelectronic devices. Various processes generate particles and different apparatus and methods have been employed to reduce or eliminate particle generation. For example, deposition of a patterning film and the subsequent removal thereof may generate particles at a greater incidence near the edge of the substrate due to bevel edge defects.

A method of reducing particle generation in this example is to utilize an edge ring which protects the edge of the substrate during deposition/etching processes. The edge ring is generally effective in reducing particle generation due to the bevel edge defects; however, subsequent film deposition processes suffer from thickness non-uniformities due to the alteration of the plasma field near the edge of the substrate. Thus, in certain processes, the presence of the edge ring adversely affects the uniformity of films by altering the thickness of the films across the surface of the substrate.

Therefore, what is needed in the art is an apparatus which reduces particle generation during semiconductor processing while maintaining or improving film thickness uniformity across the surface of the substrate.

SUMMARY

In one embodiment, an apparatus for processing a substrate is provided. The apparatus includes a chamber body defining a processing volume. A pedestal may be disposed within the processing volume and an edge ring may be disposed on the pedestal. A faceplate may be coupled to the chamber body opposite the pedestal in the chamber volume. The faceplate comprises a first region having a first density of holes formed therethrough and a second region having a second density of holes formed therethrough. The second region may surround the first region and the second density of holes may be less than the first density of holes.

In another embodiment, an apparatus for processing a substrate is provided. The apparatus includes a chamber body defining a processing volume and pedestal may be disposed within the processing volume. An aluminum nitride edge ring may be disposed on the pedestal and an aluminum faceplate may be coupled to the chamber body opposite the pedestal in the processing volume. The faceplate comprises a circle shaped region having a first density of holes formed there through. The first density of holes may be about 50 holes/in². A ring shapes region may have a second density of holed formed therethrough surrounding the first region and the second density of holes may be about 30 holes/in².

In yet another embodiment, a faceplate apparatus is provided. The faceplate apparatus includes a circular shaped aluminum body. A circle shaped region of the body may have a first density of holed for therethrough. The first density of holes may be between about 20 holes/in² and about 100 holes/in². A ring shaped region of the body may have a second density of holes formed therethrough surrounding the first region. The second density of holes may be between about 60% and about 80% of the first density of holes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a faceplate for improving film uniformity. A semiconductor processing apparatus includes a pedestal, an edge ring and a faceplate having distinct regions with differing hole densities. The faceplate has an inner region and an outer region which surrounds the inner region. The inner region has a greater density of holes formed therethrough when compared to the outer region. The inner region is sized to correspond with a substrate being processed while the outer region is sized to correspond with the edge ring.

Figure 1:
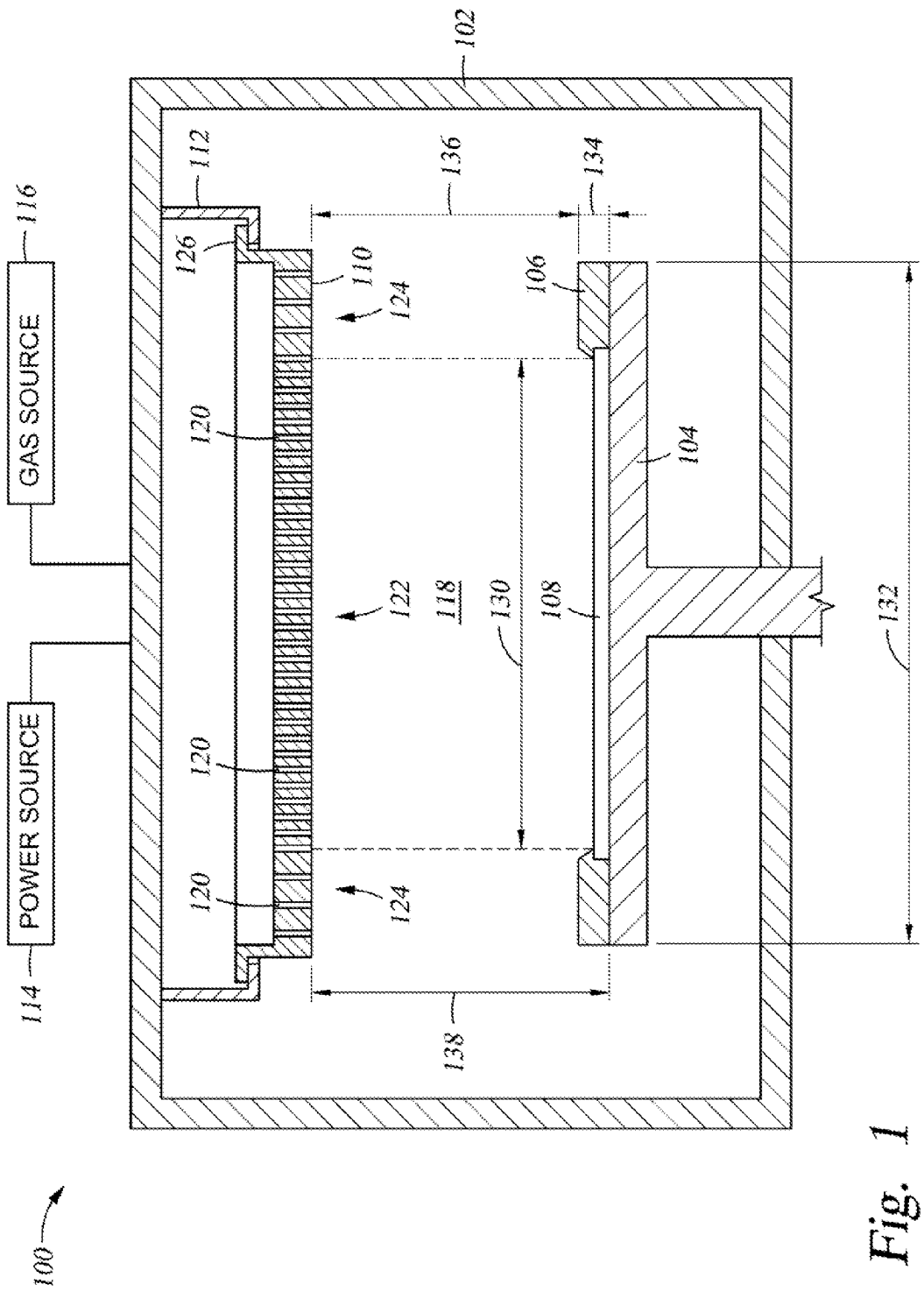
FIG. 1 illustrates a schematic, cross-sectional view of a processing chamber according to one embodiment described herein.

FIG. 1 illustrates a schematic, cross-sectional view of a processing chamber 100. The chamber 100 includes a chamber body 102 which defines a processing volume 118, a pedestal 104, an edge ring 106 and a faceplate 110. The chamber body 102 is made from a metallic material, such as stainless steel or aluminum. A power source 114 and a gas source 116 are coupled to the chamber body 102. The power source 114 may be an RF power source configured to form a capacitively coupled plasma within in the processing volume 118 of the chamber 100. The gas source 116 delivers processing and other gases to the chamber 110. The process gases are distributed to the processing volume 118 through the faceplate 110 or showerhead.

One example of a suitable processing chamber is the PRODUCER® system, available from Applied Materials, Inc., Santa Clara, Calif. It is contemplated that other suitably configured systems from other manufacturers may advantageously employ the embodiments, or various aspects thereof, described herein.

The faceplate 110 is disposed within the processing volume 118 and coupled to the chamber body 102. A ledge 126, or other similar structure, of the faceplate 110 is configured to mate with a coupling apparatus 112. The coupling apparatus 112 spaces the faceplate 110 from the chamber body 102 and positions the faceplate 110 within the processing volume 118. The faceplate 110 and the coupling apparatus 112 are fastened together by a bolt or screw, or other similar fastening apparatus.

The pedestal 104 is moveably disposed within the processing volume 118 and is configured to support a substrate 108 and the edge ring 106 during processing. The pedestal 104 may also incorporate a heater to heat the substrate 108. The substrate 108 is disposed on the pedestal 104 and an edge region of the substrate 106 is covered by a portion the edge ring 106 which extends over the edge of the substrate 108 around the entire circumference of the substrate 108. An example of a substrate 108 may be a 200 mm substrate, a 300 mm substrate, or a 450 mm substrate. The edge ring 106 is sized to accommodate the size of the substrate 108 being processed.

The edge ring 106 is annular in shape and a portion of the edge ring 106 covers the edge of the substrate 108. In one example, an inner diameter 130 of the edge ring 106 is between about 190 mm and about 450 mm, such as between about 290 mm and about 300 mm. An outer diameter 132 of the edge ring 106 is between about 250 mm and about 600 mm, such as about 370 mm. A thickness 134 of the edge ring 106 is between about 70 mil and about 110 mil, such as between about 80 mil and about 100 mil, such as about 90 mil. The edge ring 106 is made of a dielectric material such as an oxide or nitride, for example, aluminum nitride.

During processing, a distance 136 between the edge ring 134 and the faceplate 110 is between about 140 mil and about 1030 mil, such as about 210 mil. A distance 138 between the pedestal 104 supporting surface and the faceplate 110 is between about 250 mil and about 1100 mil, such as about 300 mil. Process spacing is one of many factors which affect the uniformity of films formed on the substrate 108. The presence of the edge ring 106 increases the electrical field near the edge of the substrate 108 which results in a greater ion flux. The increased ion flux near the edge of the substrate 108 and the edge ring 106 results in an increased deposition rate during processing which results in a thicker film near the edge of the substrate 108.

The faceplate 110 has an inner region 122 and an outer region 124 with difference hole 120 densities to accommodate for the plasma modulation by the presence of the edge ring 106 in the chamber 100. The holes 120 extend through the faceplate 110 and deliver gas from the gas source 116 to the processing volume 118. In operation, the faceplate 110 is capacitively coupled to the power source 114 and RF power causes the gas to form a plasma in the processing region 118. In another embodiment, a remote plasma source may be utilized to provide a plasma to the processing region 118.

The inner region 122 has a first density of holes 120 formed therethrough and the outer region 124 has a second density of holes 120 formed therethrough. The second density of the holes 120 in the outer region 124 is at least 20% less than the first density of holes 120 in the inner region 122. For example, the first density of holes 120 in the inner region 122 is between about 20 holes/in$^2$ and about 100 holes/in$^2$, such as about 50 holes/in$^2$ and the second density of holes in the outer region 124 is between about 5 holes/in$^2$ and about 95 holes/in$^2$, such as about 30 holes/in$^2$. In one embodiment, the second density of holes 120 is between about 60% and about 80%, such as about 70%, of the first density of holes 120 in the inner region.

The inner region 122 of the faceplate 110 is aligned above the substrate 108 and the outer region 124 of the faceplate 110 is aligned above the edge ring 106. The second density of holes 120 of the outer region 124 reduces the amount of gas provided over the edge ring 106 near the edge of the substrate 108. As a result, the plasma modulation effects of the edge ring 106 (i.e. increased electrical field and ion flux) are reduced or eliminated.

In one example, the uniformity profile of a deposited film was examined utilizing a faceplate having a constant hole density across the entire faceplate compared to the uniformity profile provided from the faceplate 110 having varying hole densities across the faceplate 110. The constant hole density faceplate deposited a film with a thickness uniformity having a variation of about 7.59%. The faceplate 110 with the inner region 122 having a greater hole 120 density compared to the outer region 124 provided a film thickness uniformity with a variation of 1.54%. Thus, the faceplate 110 increased the uniformity of the film by modulating the plasma profile near the edge of the substrate 108. As such, the negative effects of the edge ring 106 were eliminated or reduced by the hole 120 density profile of the faceplate 110.

Figure 2:
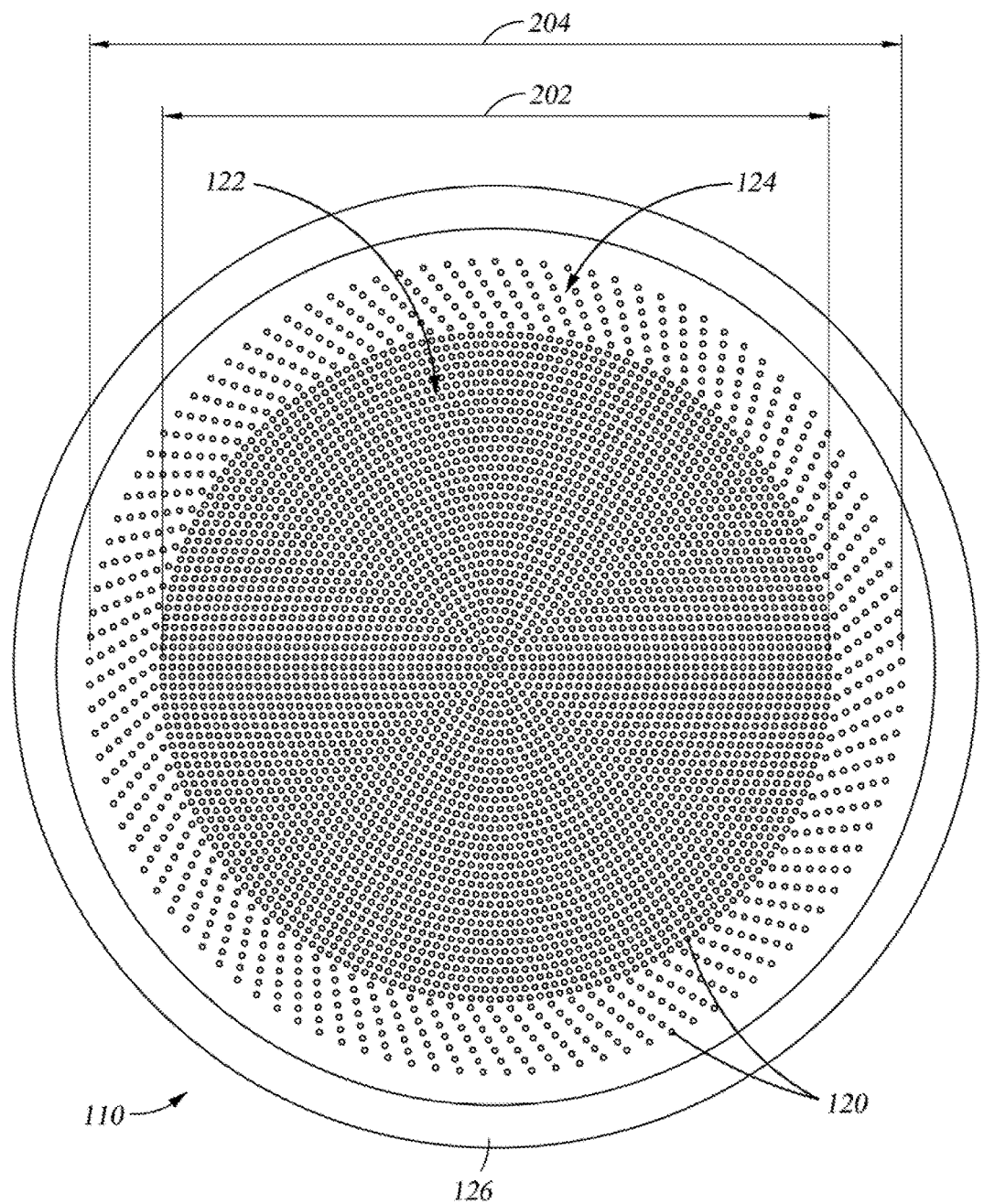
FIG. 2 illustrates a bottom view of a faceplate according to one embodiment described herein.

FIG. 2 is a bottom view of the faceplate 110. The inner region 122 is circular in shape and has a greater density of holes 120 when compared to the hole 120 density of the outer region 124. A diameter 202 of the inner region 122 corresponds to the inner diameter 130 of the edge ring 106. For example, the diameter 202 of the inner region 122 is between about 250 mm and about 350 mm, such as between about 290 and about 300 mm. The outer region 124 is annular, or ring-like, in shape and surrounds the inner region 122. An outer diameter 204 of the outer region 124 corresponds to the outer diameter 132 of the edge ring 106. For example, the outer diameter 204 of the outer region 124 is between about 200 mm and about 450 mm, such as about 300 mm.

The inner region 122 and outer region 124 of the faceplate 110 are sized to occupy a similar area defined by the substrate 108 and edge ring 106, respectively. Thus, the inner region 122 is sized similarly to the substrate 108 and the outer region 124 is sized similarly to the edge ring 106.

The spacing of the holes 120 may be changed by varying spacing of the holes 120 along circular lines in the outer region 124 of the faceplate 110. For example, the holes 120 in the inner region 122 are more closely spaced from one another when compared to the spacing of the holes 120 in the outer region 124. Thus, the density of holes 120 in the outer region 124 is less than the density of holes 120 in the inner region. In one embodiment, the holes 120 are positioned on concentric rings.

Figure 3:
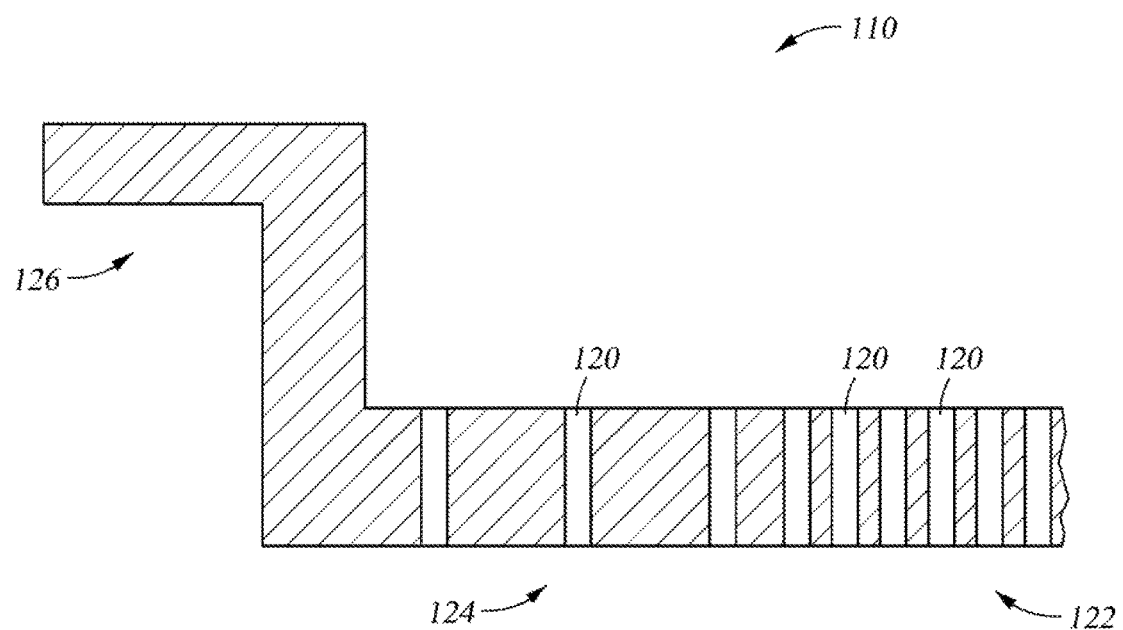
FIG. 3 illustrates a partial, cross sectional view of the faceplate of FIG. 2 according to one embodiment described herein.

FIG. 3 is a partial, cross-sectional view of the faceplate 110 of FIG. 2. The inner region 122 has the first hole 120 density which is greater than the hole 120 density of the outer region 124. The holes 120 in both the inner and outer regions 122, 124 have similar dimensions. In this manner, the reduction in hole 120 density in the outer region 124 reduces the plasma density on the outer region 124. However, it is contemplated that the dimensions of the holes 120 may vary between the inner region 122 and the outer region 124 in order to further define the plasma density on the different regions 122, 124.

In sum, the processing chamber 100 includes the pedestal 104 upon which the substrate 108 and edge ring 106 are disposed. The faceplate 110 is disposed within the processing volume 118 opposite the pedestal 104. The faceplate 110 has the inner region 122 sized similarly to the substrate 108 and the outer region 124 sized similarly to the edge ring 106. The first hole 120 density of the inner region 120 is greater than the hole 120 density of the outer region 124. The varying hole 120 densities of the inner region 122 and outer region 124 enable plasma modulation near the edge ring 106 and substrate 108 edge which provides for improved film thickness uniformity across the surface of the substrate 108.

While the foregoing is directed to embodiments of the present disclosure, other and further embodiments of the disclosure may be devised without departing from the basic scope thereof, and the scope thereof is determined by the claims that follow.

The invention claimed is:

1. An apparatus for processing a substrate, comprising:
   a chamber body defining a processing volume;
   a pedestal disposed within the processing volume;
   an edge ring disposed on the pedestal; and
   a faceplate coupled to the chamber body opposite the pedestal in the processing volume, the faceplate comprising:
   a first region having a first uniform density of holes formed therethrough; and
   a second region having a second uniform density of holes formed therethrough and surrounding the first region, wherein the second uniform density of holes is no more than 80% of the first uniform density of holes, a hole size of holes in the first region and a hole size of holes in the second region are the same, an inner diameter of the second region is aligned above an inner diameter of the edge ring, and an outer diameter of the second region is aligned above an outer diameter of the edge ring.

2. The apparatus of claim 1, wherein the first region is circle shaped and sized to correspond to a substrate being processed.

3. The apparatus of claim 2, wherein the second region is ring shaped and sized to correspond to the edge ring.

4. The apparatus of claim 1, wherein the first uniform density of holes is between about 20 holes/in$^2$ and about 100 holes/in$^2$.

5. The apparatus of claim 4, wherein the second uniform density of holes is between about 5 holes/in$^2$ and about 95 holes/in$^2$.

6. The apparatus of claim 1, wherein the second uniform density of holes is between about 60% and about 80% of the first uniform density of holes.

7. The apparatus of claim 6, wherein the holes are positioned on concentric rings.

8. The apparatus of claim 1, wherein a diameter of the first region of the faceplate corresponds to an inner diameter of the edge ring.

9. The apparatus of claim 1, wherein the faceplate comprises an aluminum material.

10. The apparatus of claim 1, wherein the edge ring comprises a dielectric material.

11. The apparatus of claim 10, wherein the edge ring comprises aluminum nitride.

12. The apparatus of claim 1, wherein a distance between the pedestal in a processing position and the faceplate is between about 250 mil and about 350 mil.

13. The apparatus of claim 1, wherein a distance between the edge ring in a processing position and the faceplate is between about 190 mil and about 230 mil.

14. An apparatus for processing a substrate, comprising:
   a chamber body defining a processing volume;
   a pedestal disposed within the processing volume;
   an aluminum nitride edge ring disposed on the pedestal; and
   an aluminum faceplate coupled to the chamber body opposite the pedestal in the processing volume, the faceplate comprising:
   a circle shaped region of the faceplate having a first uniform density of holes formed therethrough, wherein the first uniform density of holes is about 50 holes/in$^2$; and
   a ring shaped region having a second uniform density of holes formed therethrough surrounding the circle shaped region, wherein the second uniform density of holes is about 30 holes/in$^2$, a hole size of holes in the circle shaped region and a hole size of holes in the ring shaped region are the same, an inner diameter of the ring shaped region is aligned above an inner diameter of the edge ring, and an outer diameter of the ring shaped region is aligned above an outer diameter of the edge ring.

15. The apparatus of claim 2, wherein a diameter of the first region is between about 250 mm and about 350 mm.

16. The apparatus of claim 3, wherein the outer diameter of the second region is between about 200 mm and about 450 mm.

17. The apparatus of claim 14, wherein a diameter of the circle shaped region is between about 250 mm and about 350 mm.

18. The apparatus of claim 14, wherein the outer diameter of the ring shaped region is between about 200 mm and about 450 mm.

* * * * *